(12) United States Patent
Gopalaratnam et al.

(10) Patent No.: US 7,301,102 B1
(45) Date of Patent: Nov. 27, 2007

(54) ELEVATED TRACK FOR SUPPORT OF SIGNAL LINES ON A PRINTED CIRCUIT BOARD ASSEMBLY

(75) Inventors: Sriram Gopalaratnam, Cupertino, CA (US); Sameer Kumar Gupta, Pleasanton, CA (US)

(73) Assignee: Cisco Technology, Inc., San Jose, CA (US)

( * ) Notice: Subject to any disclaimer, the term of this patent is extended or adjusted under 35 U.S.C. 154(b) by 54 days.

(21) Appl. No.: 10/716,268

(22) Filed: Nov. 17, 2003

(51) Int. Cl.
*H05K 1/00* (2006.01)
(52) U.S. Cl. ..................... 174/250; 174/260
(58) Field of Classification Search .............. 174/250, 174/260; 333/247, 246, 238
See application file for complete search history.

(56) References Cited

U.S. PATENT DOCUMENTS

| | | | | |
|---|---|---|---|---|
| 4,873,764 A | * | 10/1989 | Grimm | 29/830 |
| 5,561,271 A | * | 10/1996 | Bruck et al. | 174/117 R |
| 5,719,748 A | * | 2/1998 | Cullinan et al. | 361/764 |
| 6,061,241 A | * | 5/2000 | Handforth et al. | 361/704 |
| 6,392,901 B1 | * | 5/2002 | Colver et al. | 361/826 |
| 6,399,899 B1 | * | 6/2002 | Ohkawa et al. | 174/261 |
| 2003/0019657 A1 | * | 1/2003 | Seigerschmidt | |
| 2003/0107874 A1 | * | 6/2003 | Feigenbaum et al. | |
| 2003/0180974 A1 | * | 9/2003 | Akram | |

* cited by examiner

*Primary Examiner*—Dean A. Reichard
*Assistant Examiner*—Yuriy Semenenko
(74) *Attorney, Agent, or Firm*—Sierra Patent Group, Ltd.

(57) ABSTRACT

A printed circuit board assembly utilizing an elevated track to support signal lines between components is disclosed. The track rests on a plurality of vertical supports, placed amid the components, such that the signal lines can be routed after the components are configured on the board. The vertical supports can be installed at grounding holes already present on the printed circuit board assembly. The track is sufficiently rigid to support bundles of signal lines over long spans between vertical supports. The track can be constructed of the same material as the board, to provide the same ESD and conductivity characteristics as the board, as well as ensure that the track does not contribute to the EMI signature of the board.

16 Claims, 3 Drawing Sheets

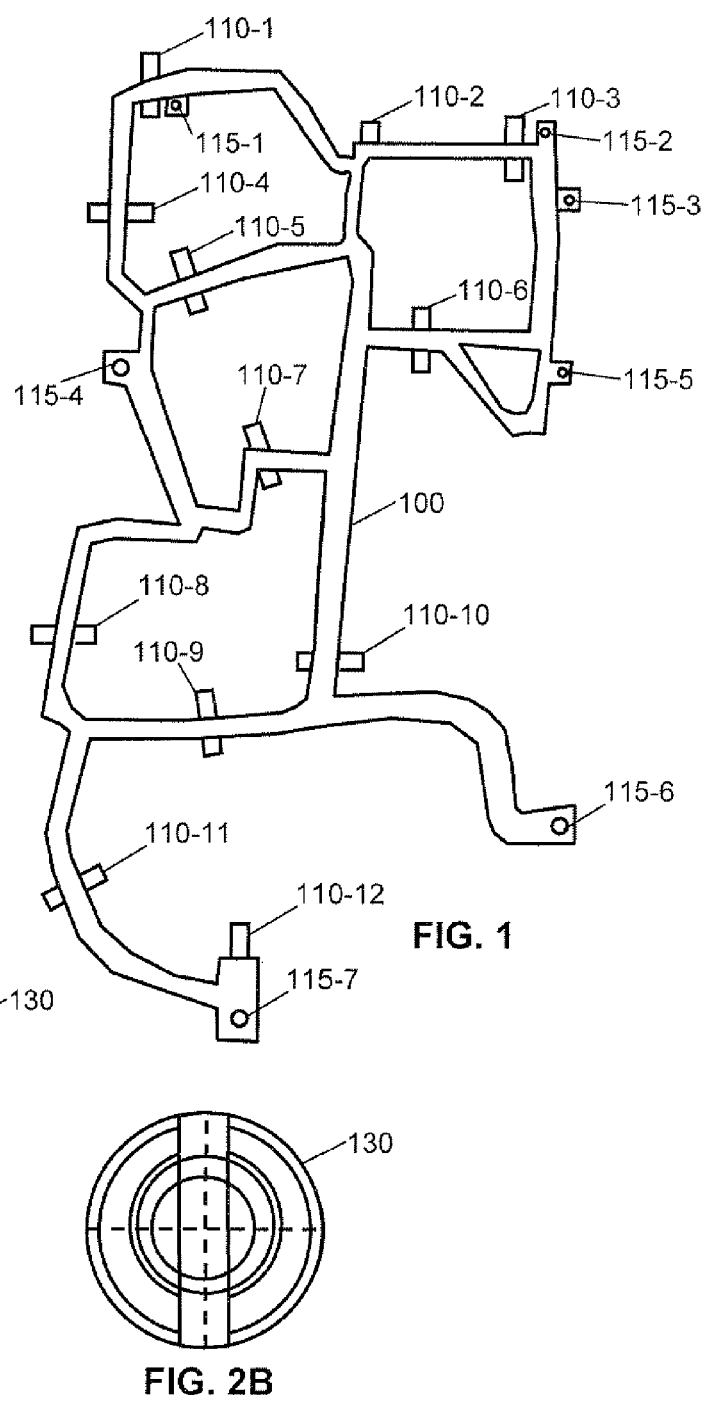

ELEVATED TRACK FOR SUPPORT OF SIGNAL LINES ON A PRINTED CIRCUIT BOARD ASSEMBLY

FIELD OF THE INVENTION

The present invention relates broadly to the field of printed circuit board assemblies. Specifically, the present invention relates to routing of signal lines between components on a printed circuit board assembly. More specifically, the present invention relates to an elevated track that supports signal lines attached between components on a printed circuit board assembly.

BACKGROUND OF THE INVENTION

As more and more functionality and processing power is packed into printed circuit board assemblies (PCBAs), less and less room is available to the design engineer for cable routing. The space that is available may lead to a counter-intuitive cable path, which would cause problems with the board assembly.

Prior approaches to solving the problem of cable routing on a PCBA normally fall into two distinct categories based on their attachment method: mechanical or adhesive. However, prior solutions impose their own design requirements, such as a specific board thickness or specific mounting hole size or shape (mechanical attachment approaches) or a specific amount of dedicated space on the PCBA (both mechanical and adhesive approaches). Adhesive approaches also suffer from a service-life aspect. The adhesive is bonded to a backing material, typically foam, which deteriorates over time. It is very difficult to estimate the degradation time and often expensive and time-consuming testing is required to determine how the adhesive attachment will age under given operating conditions.

SUMMARY OF THE INVENTION

The present invention addresses the problems described above and provides a track that supports signal lines, such as cables or fiber bundles utilized in the PCBA design, that is elevated above the electrical components on a PCBA. The track snakes around existing board components so it can be configured after a PCBA layout is completed. Custom clips or off-the-shelf parts (preferably mechanical attachment parts) can be placed on the track to provide the ability to restrain fibers or cables placed on top of the track, to provide stability in the event that the PCBA is moved or tilted. Existing grounding holes in the PCBA can be used for track mounting points, effectively imposing no new requirements upon the board design. The track is fairly rigid and will not deflect under moderate cable or fiber loading, which makes it ideal for use in areas with heavy trace densities or other situations where it may be impossible to provide closely located vertical supports. The elevated track can also be used to run power to different locations on the PCBA. Such an application is useful in situations where a power problem is caught late in a project's development and it's decided that a patchwork approach is needed, or when the PCBA is placed in multiple chassi where external connections are not located in the same areas as the original design dictated. While the track is useful to support signal lines between components on the PCBA, it also can be used to support lines that connect the PCBA to external devices.

Embodiments of the present invention utilize UL94-V0 rated materials that are non-conductive, and able to accommodate clips or other fasteners used to secure fiber or cable bundles to the track. Fasteners used to secure the track to the PCBA are preferably mechanical, and the track is configured to provide generous bend radii for cables or fiber bundles. The dimensions of the track according to embodiments of the present invention do not exceed maximum height requirements above the PCBA. Preferred embodiments of the track of the present invention utilize a minimum number of vertical supports so that the track can be easily repositioned if the layout of components within the PCBA needs to be reconfigured.

Additional features and advantages of the present invention will become apparent to those skilled in the art upon reading the following detailed description, when considered in conjunction with the accompanying drawings, in which:

BRIEF DESCRIPTION OF THE DRAWINGS

FIG. 1 is a view of the bottom of the track of the present invention;

FIGS. 2A and 2B are a profile view and a plan view, respectively, of a vertical support used in embodiments of the present invention to elevate the track of the present invention above components located on a printed circuit board assembly;

DETAILED DESCRIPTION

Figure 3:
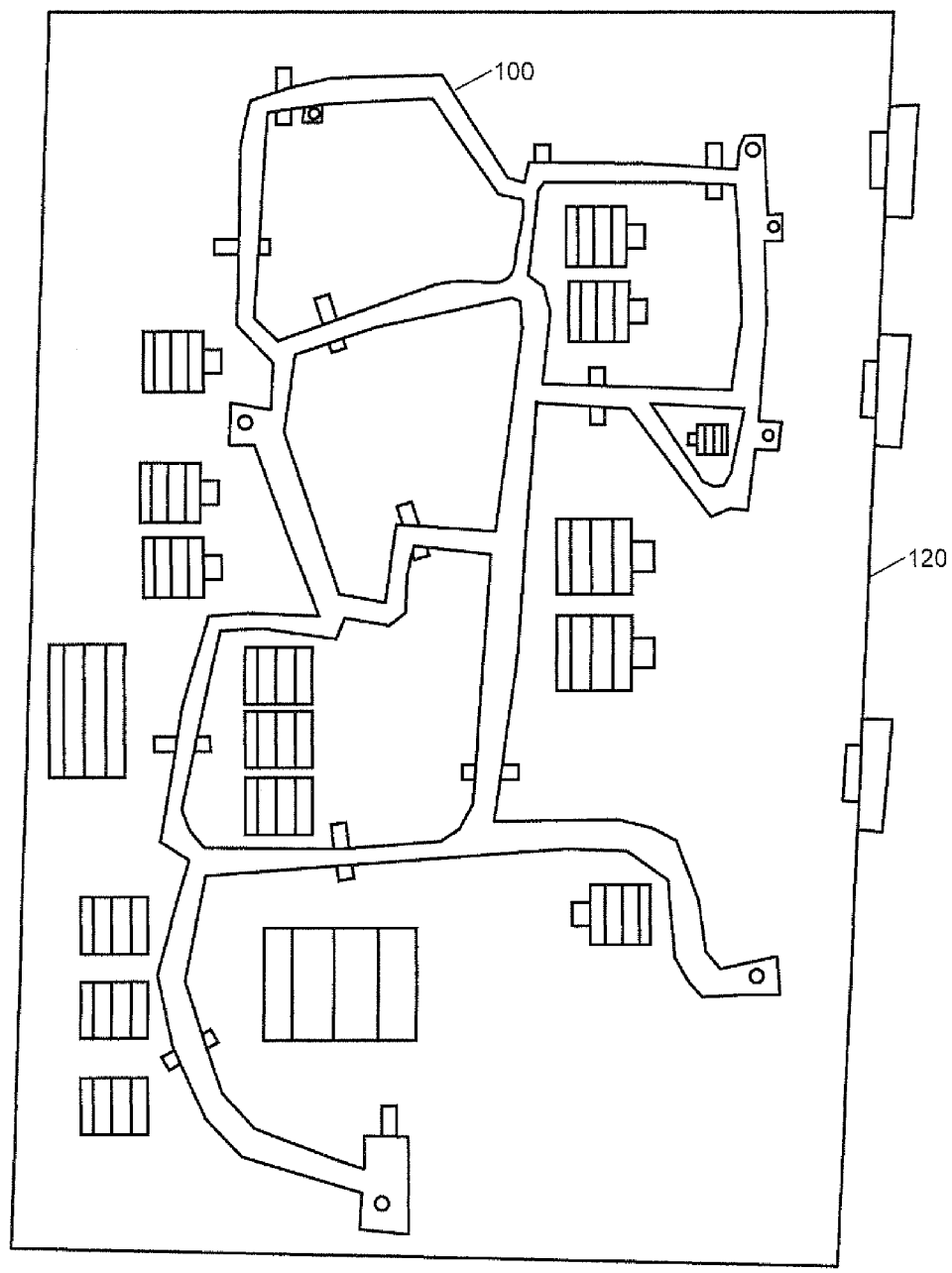
FIG. 3 is a view of the track of the present invention placed over a printed circuit board assembly.

Directing attention to FIG. 1, a plan view of track 100 is shown. Track 100 is sufficiently dimensioned to accommodate a plurality of signal lines, such as bundles of cabling or fiber optic lines that connect various components present in a printed circuit board assembly. In a preferred embodiment, track 100 is constructed from FR4, the same material used in the main board of a printed circuit board assembly, thus track 100 has the same electrostatic discharge (ESD) and conductivity characteristics as the main board, and does not contribute to the electromagnetic interference (EMI) signature of the board. Track 100 has sufficient thickness to be rigid enough to support desired amounts of signal lines over spans between vertical supports that elevate track 100 above a printed circuit board assembly. However, track 100 is also sufficiently malleable to provide some flexibility so that minor layout changes on the printed circuit board assembly can be made and track 100 can be repositioned without having to be cut and reassembled. Track 100 imposes no constraints upon the design or layout of the printed circuit board, as track 100 can be configured as needed to accommodate a wide variety of board layouts. Track 100 can also aid assemblers by showing communication line paths between various components. In other embodiments, track 100 can be constructed from Statex, a material similar to Formex, but having a coating on one side to make the Statex anti-static. G10, another material similar to FR4, can also be used to construct track 100. Various other materials, such as plastic, rubber, other types of fiberglass and metals can be used. Factors to consider before selecting a material may include clock speeds that are near track 100, component density near track 100, the presence of passive components, such as resistors, caps, etc., near track 100, and the presence of active components such as processors, asics, etc., near track 100. In embodiments where metal is used to construct track 100, such as aluminum or steel, a powder coating can be utilized on track 100. Powder coating provides advantages of making track 100 non-conductive so that it wont short circuit board components if it touches them, and powder coating is more scratch resistant than wet paint. Retaining clips 110 are also shown attached to track 100 at various locations. Retaining clips 110 are used to secure the signal lines to track 100. While 12 retaining clips are illustrated in FIG. 1, it is to be understood that the number of retaining clips can vary as needed to suit particular configurations of PCBAs. In other embodiments, various other types of retainers can be used, such as plastic wire ties, metal wire, string, or other suitable items that provide a securing mechanism to keep signal lines from falling off track 100 onto PCBA 120 (shown in FIG. 3).

In the preferred embodiment, track 100 fastens to vertical supports 130 (shown in FIGS. 2A and 2B) at support points 115. A screw or other fastener is driven through track 100 into the top of vertical support 130 at support point 115, and the threaded portion of vertical support 130 is driven through the bottom of PCBA 120 into a metal carrier (not shown) that backs PCBA 120. Preferably, vertical supports 130 are driven through PCBA 120 at pre-existing grounding holes present in PCBA 120.

Directing attention to FIG. 3, track 100 can be installed above PCBA 120 after components are arranged on PCBA 120. Once components are arranged as desired on the printed circuit board, the particular configuration of track 100 can be fashioned. Vertical supports 130 are placed between components as desired, and track 100 is configured to rest on vertical supports 130 above the components of PCBA 120. Vertical supports 130 can be attached to PCBA 120 either by mechanical fasteners or adhesive placed between PCBA 120 and vertical supports 130. Track 100 can also be attached to vertical supports 130 by mechanical fasteners or adhesive. In the preferred embodiment, vertical supports 130 are fashioned from metal standoffs. In this embodiment, vertical supports 130 are sturdy and provide sufficient strength to fasten vertical supports 130 to PCBA 120 with screws or directly thread into the PCBA carrier. Other materials can be used for vertical supports 130 in other embodiments, such as Formex, Statex, plastic, rubber, glass, and other types of fiberglass.

Figure 4:
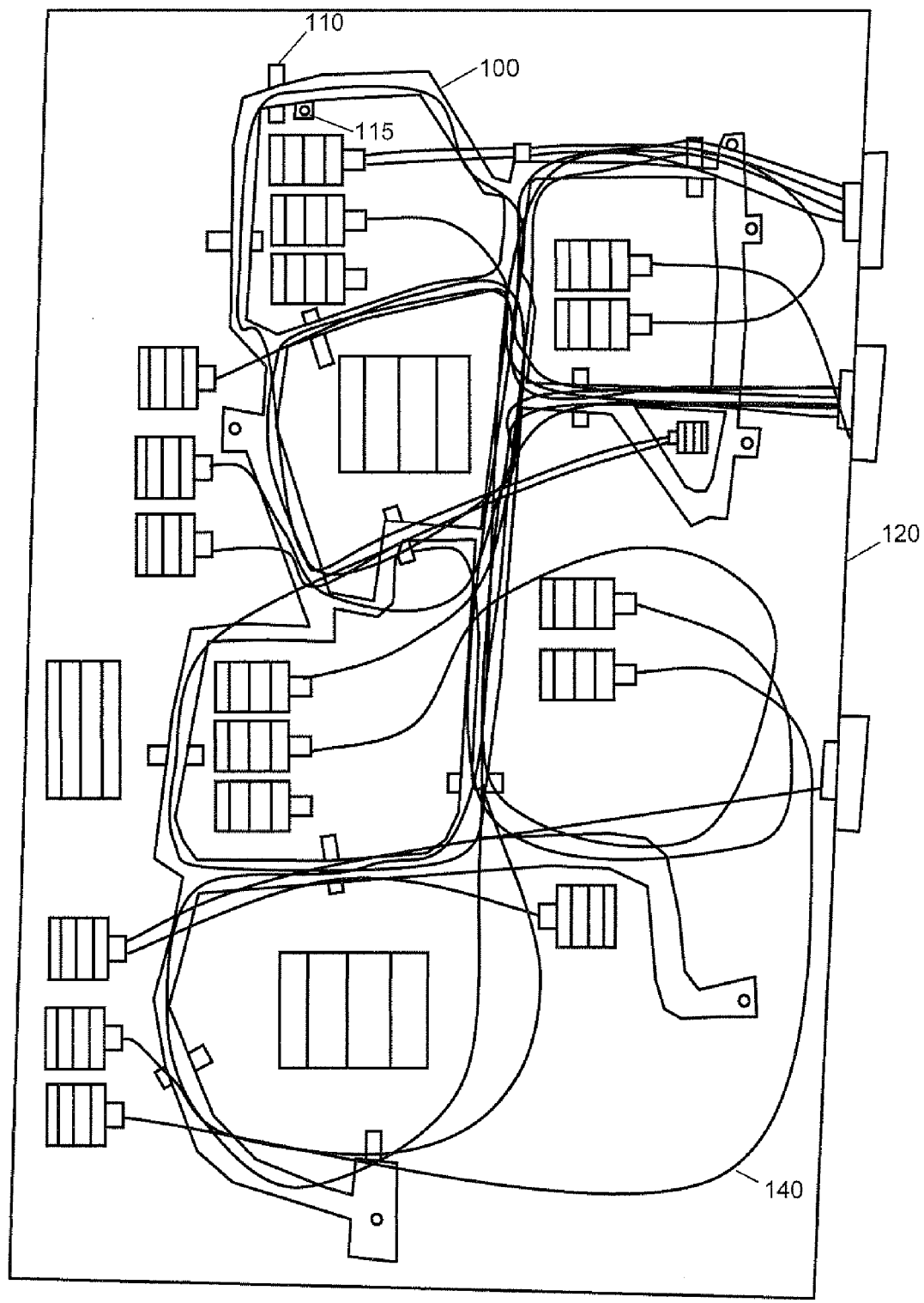
FIG. 4 is a view of the track of the present invention placed over a printed circuit board assembly with signal lines placed on top of the track.

Directing attention to FIG. 4, signal lines 140 are shown placed on track 100. Signal lines 140 connect the various components shown, and provide communication between these components.

While an apparatus for elevating signal lines above components located on a printed circuit board assembly has been described and illustrated in detail, various modifications can be made to embodiments of the present invention without departing from the spirit of the invention.

What is claimed is:

1. A printed circuit board assembly, comprising:
   electronic components, the electronic components configured to provide a communication infrastructure for transmission of data, at least some of the electronic components in communication with each other via signal lines;
   an elevated track, the elevated track supporting the signal lines above the electronic components such that the signal lines can be configured between the electrical components after the electronic components are configured; and
   a plurality of vertical supports, the vertical supports placed on the surface of the printed circuit board assembly amid the electrical components, wherein the elevated track is supported above the electronic components by the plurality of vertical supports.

2. The printed circuit board assembly of claim 1, wherein the signal lines comprise communication lines.

3. The printed circuit board assembly of claim 1, wherein the signal lines comprise power lines.

4. The printed circuit board assembly of claim 1, wherein the signal lines connect the printed circuit assembly board to an external device.

5. The printed circuit board assembly of claim 1, wherein the track is constructed from fiberglass.

6. The printed circuit board assembly of claim 5, wherein the fiberglass comprises FR4 fiberglass.

7. The printed circuit board assembly of claim 1, wherein the track is constructed from Formex.

8. The printed circuit board assembly of claim 1, wherein the track is constructed from Statex.

9. The printed circuit board assembly of claim 8, wherein the track has an anti-static coating.

10. The printed circuit board assembly of claim 1, wherein the track is constructed from plastic.

11. The printed circuit board assembly of claim 1, wherein the track is constructed from metal.

12. The printed circuit board assembly of claim 1, wherein the track has a powder coating.

13. The printed circuit board assembly of claim 1, wherein the track is constructed from glass.

14. The printed circuit board assembly of claim 1, wherein the track is constructed from rubber.

15. The printed circuit board assembly of claim 1, wherein the track is sufficiently flexible to allow reshaping of the track.

16. The printed circuit board assembly of claim 1, wherein the track is attached by screws to the vertical supports.

* * * * *